United States Patent
Shapovalov et al.

(10) Patent No.: US 9,577,143 B1
(45) Date of Patent: Feb. 21, 2017

(54) BACKFLOW REACTOR LINER FOR PROTECTION OF GROWTH SURFACES AND FOR BALANCING FLOW IN THE GROWTH LINER

(71) Applicant: Ostendo Technologies, Inc., Carlsbad, CA (US)

(72) Inventors: Lisa Shapovalov, Gaithersburg, MD (US); Oleg Kovalenkov, Gaithersburg, MD (US); Vladimir Ivantsov, Hyattsville, MD (US); Alexander Syrkin, Montgomery Village, MD (US)

(73) Assignee: Ostendo Technologies, Inc., Carlsbad, CA (US)

( * ) Notice: Subject to any disclaimer, the term of this patent is extended or adjusted under 35 U.S.C. 154(b) by 777 days.

(21) Appl. No.: 13/917,408

(22) Filed: Jun. 13, 2013

Related U.S. Application Data

(60) Provisional application No. 61/660,586, filed on Jun. 15, 2012.

(51) Int. Cl.

| | |
|---|---|
| *C30B 25/02* | (2006.01) |
| *C30B 25/14* | (2006.01) |
| *H01L 33/00* | (2010.01) |
| *C30B 25/16* | (2006.01) |
| *C23C 16/455* | (2006.01) |

(52) U.S. Cl.
CPC ......... *H01L 33/0075* (2013.01); *C23C 16/455* (2013.01); *C23C 16/45519* (2013.01); *C30B 25/14* (2013.01); *C30B 25/16* (2013.01); *C30B 25/165* (2013.01)

(58) Field of Classification Search
USPC .......................................... 156/913; 117/952
See application file for complete search history.

(56) References Cited

U.S. PATENT DOCUMENTS

| | | | |
|---|---|---|---|
| 4,144,116 A | 3/1979 | Jacob et al. | |
| 4,592,307 A * | 6/1986 | Jolly ................... | C23C 16/4401 118/719 |

(Continued)

OTHER PUBLICATIONS

Amano, H., et al., "Metalorganic vapor phase epitaxial growth of a high quality GaN film using an AlN buffer layer", *Applied Physics Letters*, vol. 48, No. 5, (Feb. 3, 1986), pp. 353-355.

(Continued)

*Primary Examiner* — Gordon R Baldwin
*Assistant Examiner* — Aiden Lee
(74) *Attorney, Agent, or Firm* — Blakely Sokoloff Taylor & Zafman LLP

(57) ABSTRACT

A backflow liner in an epitaxial growth system is provided in order to control gas flow and protect the surface of substrates throughout an epitaxial growth cycle. The backflow liner provides critical protection during the warming time prior to substrate pre-treatment, while the growth environment reaches steady state condition between the pre-treatment and the growth process, during pauses between the layer depositions in case of multilayer structure growth, and during the cooling process. The direction of the gas flow through the backflow liner is counter to the deposition gas flows directed from the source end of the growth system. The backflow liner is therefore designed to shape the flow of gases to prevent formation of the vortex-type streams in the growth system that may negatively affect the growth process.

22 Claims, 5 Drawing Sheets

(56) References Cited

U.S. PATENT DOCUMENTS

| | | | |
|---|---|---|---|
| 4,761,269 A * | 8/1988 | Conger | C23C 16/45561 |
| | | | 118/679 |
| 6,218,269 B1 | 4/2001 | Nikolaev et al. | |
| 6,528,394 B1 | 3/2003 | Lee | |
| 6,559,038 B2 | 5/2003 | Nikolaev et al. | |
| 6,613,143 B1 | 9/2003 | Melnik et al. | |
| 6,632,725 B2 | 10/2003 | Trassoudaine et al. | |
| 6,656,272 B2 | 12/2003 | Tsvetkov et al. | |
| 6,656,285 B1 | 12/2003 | Melnik et al. | |
| 6,660,083 B2 | 12/2003 | Tsvetkov et al. | |
| 6,890,809 B2 | 5/2005 | Karpov et al. | |
| 6,955,719 B2 | 10/2005 | Dmitriev et al. | |
| 6,969,426 B1 | 11/2005 | Bliss et al. | |
| 7,220,324 B2 | 5/2007 | Baker et al. | |
| 7,276,121 B1 | 10/2007 | Bliss et al. | |
| 7,279,047 B2 | 10/2007 | Melnik et al. | |
| 7,621,999 B2 | 11/2009 | Koukitu et al. | |
| 7,670,435 B2 | 3/2010 | Tsvetkov et al. | |
| 7,727,333 B1 | 6/2010 | Syrkin et al. | |
| 7,976,631 B2 | 7/2011 | Burrows et al. | |
| 8,138,069 B2 | 3/2012 | Melnik et al. | |
| 8,840,726 B2 | 9/2014 | Li et al. | |
| 8,841,118 B2 | 9/2014 | Robinson et al. | |
| 2002/0022286 A1 | 2/2002 | Nikolaev et al. | |
| 2002/0155713 A1 | 10/2002 | Tsvetkov et al. | |
| 2002/0177312 A1 | 11/2002 | Tsvetkov et al. | |
| 2003/0013222 A1 | 1/2003 | Trassoudaine et al. | |
| 2003/0049898 A1 | 3/2003 | Karpov et al. | |
| 2004/0112290 A1 * | 6/2004 | Li | C23C 16/4401 |
| | | | 118/715 |
| 2004/0137657 A1 | 7/2004 | Dmitriev et al. | |
| 2005/0056222 A1 | 3/2005 | Melnik et al. | |
| 2006/0205199 A1 | 9/2006 | Baker et al. | |
| 2007/0090369 A1 * | 4/2007 | Kobayakawa | C30B 25/02 |
| | | | 257/77 |
| 2008/0063584 A1 | 3/2008 | Koukitu et al. | |
| 2010/0012948 A1 | 1/2010 | Usikov et al. | |
| 2010/0215854 A1 | 8/2010 | Burrows et al. | |
| 2010/0273318 A1 | 10/2010 | Melnik et al. | |
| 2012/0156863 A1 | 6/2012 | Melnik et al. | |

OTHER PUBLICATIONS

Ambacher, O., "Growth and applications of Group III-nitrides", *J. Phys. D: Appl. Phys.*, vol. 31, (1998), pp. 2653-2710.

Baker, Troy J., et al., "Characterization of Planar Semipolar Gallium Nitride Films on Sapphire Substrates", *Japanese Journal of Applied Physics*, vol. 45, No. 6, (2006), pp. L154-L157.

Bohnen, Tim, et al., "Enhanced growth rates and reduced parasitic deposition by the substitution of $Cl_2$ for HCl in GaN HVPE", *Journal of Crystal Growth*, vol. 312, (2010), pp. 2542-2550.

Chengyan, Gu, et al., "Design of a three-layer hot-wall horizontal flow MOCVD reactor", *Journal of Semiconductors*, vol. 33, No. 9, (Sep. 2012), pp. 093005-1 to 093005-5.

Craven, Michael D., et al., "Characterization of α-Plane GaN/(Al,Ga)N Multiple Quantum Wells Grown via Metalorganic Chemical Vapor Deposition", *Japanese Journal of Applied Physics*, vol. 42, Part 2, No. 3A, (Mar. 1, 2003), pp. L235-L238.

Detchprohm, T., et al., "The growth of thick GaN film on sapphire substrate by using ZnO buffer layer", *Journal of Crystal Growth*, vol. 128, (1993), pp. 384-390.

Dwikusuma, F., et al., "X-ray photoelectron spectroscopic study on sapphire nitridation for GaN growth by hydride vapor phase epitaxy: Nitridation mechanism", *Journal of Applied Physics*, vol. 94, No. 9, (Nov. 2003), pp. 5656-5664.

Eastman, Lester F., et al., "The Toughest Transistor Yet", *IEEE Spectrum*, vol. 39, No. 5, (May 2002), pp. 28-33.

Fahle, D., et al., "Deposition control during GaN MOVPE", *Materials of CS MANTECH Conference*, May 13-16, 2013, New Orleans, Louisiana, USA, vol. 12, (2013), pp. 399-402.

Fahle, D., et al., "HCl-assisted growth of GaN and AlN", *Journal of Crystal Growth*, vol. 370, (2013), pp. 30-35.

Gu, Shulin, et al., "The impact of initial growth and substrate nitridation on thick GaN growth on sapphire by hydride vapor phase epitaxy", *Journal of Crystal Growth*, vol. 231, (2001), pp. 342-351.

Kang, Sang W., et al., "Prevention of In droplets formation by HCl addition during metal organic vapor phase epitaxy of InN", *Applied Physics Letters*, vol. 90, (2007), pp. 161126-1 to 161126-3.

Kim, S. T., et al., "Growth and Properties of Freestanding GaN Substrates by HVPE Using an AlN Buffer Layer Deposited on Si", *Journal of the Korean Physical Society*, vol. 33, No. 6, (Dec. 1998), pp. 736-740.

Manasevit, H. M., et al., "The Use of Metalorganics in the Preparation of Semiconductor Materials, IV. The Nitrides of Aluminum and Gallium", *J. Electrochem. Soc.*, vol. 118, No. 11, (1971), pp. 1864-1868.

Maruska, H. P., et al., "The Preparation and Properties of Vapor-Deposited Single-Crystal-Line GaN", *Applied Physics Letters*, vol. 15, No. 10, (Nov. 15, 1969), pp. 327-329.

Mastro, M. A., et al., "Influence of polarity on GaN thermal stability", *Journal of Crystal Growth*, vol. 274, (2005), pp. 38-46.

Mastro, M. A., et al., "Thermal Stability of MOCVD and HVPE GaN Layers in $H_2$, HCl, $NH_3$ and $N_2$", *phys. stat. sol. (a)*, vol. 188, No. 1, (2001), pp. 467-471.

Nakamura, Shuji, "GaN Growth Using GaN Buffer Layer", *Japanese Journal of Applied Physics*, vol. 30, No. 10A, (Oct. 1991), pp. L1705-L1707.

Nakamura, Shuji, et al., "The Blue Laser Diode, The Complete Story", Springer-Verlag Berlin Heidelberg New York, (2000), pp. 170-175 & 206-214.

Ng, H. M., "Molecular-beam epitaxy of $GaN/Al_xGa_{1-x}N$ multiple quantum wells of R-plane 10$\bar{1}$2sapphire substrates", *Applied Physics Letters*, vol. 80, No. 23, (Jun. 10, 2002), pp. 4369-4371.

Nishida, T., et al., "Ten-Milliwatt Operation of an AlGaN-Based Light Emitting Diode Grown on GaN Substrate", *phys. stat. sol. (a)*, vol. 188, No. 1, (2001), pp. 113-116.

Richter, E., et al., "Reactor and growth process opitmization for growth of thick GaN layers on sapphire substrates by HVPE", *Journal of Crystal Growth*, vol. 277, (2005), pp. 6-12.

Romanov, A. E., et al., "Strain-induced polarization in wurtzite III-nitride semipolar layers", *Journal of Applied Physics*, vol. 100, (2006), pp. 023522-1 to 023522-10.

Safvi, S. A., et al., "Optimization of Reactor Geometry and Growth Conditions for GaN Halide Vapor Phase Epitaxy", *Mat. Res. Soc. Symp. Proc.*, vol. 423, (1996), pp. 227-232.

Segal, A. S., et al., "Surface chemistry and transport effects in GaN hydride vapor phase epitaxy", *J. Crystal Growth*, vol. 270, (2004), pp. 384-395.

Waltereit, P., et al., "Nitride semiconductors free of electrostatic fields for efficient white light-emitting diodes", *Nature*, vol. 406, (Aug. 24, 2000), pp. 865-868.

Wang, F., et al., "Influences of mask width, fill factor, HCl addition and C doping on wing tilts in the epitaxial laterally overgrown GaN films by hydride vapor phase epitaxy", *Applied Physics Letters*, vol. 80, No. 25, (Jun. 24, 2002), pp. 4765-4767.

Weyers, Markus, et al., "GaN substrates by HVPE", *Proc. of SPIE*, vol. 6910, (2008), pp. 69100I-1 to 69100I-10.

Xiangqian, Xiu, et al., "Effect of Additional HCl and Substrate Nitridation on GaN Films Grown by HVPE", *Chinese Journal of Semiconductors*, vol. 24, No. 11, (Nov. 2003), pp. 1171-1175.

Xiu, X. Q., et al., "Effect of Additional HCl on the Surface Morphology of High Quality GaN on Sapphire by HVPE", *Mat. Res. Soc. Symp. Proc.*, vol. 693, (2002), pp. 135-139.

Yoshida, S., et al., "Epitaxial growth of GaN/AlN heterostructures", *J. Vac. Sci. Technol. B*, vol. 1, No. 2, (Apr.-Jun. 1983), pp. 250-253.

Yoshida, S., et al., "Improvements on the electrical and luminescent properties of reactive molecular beam epitaxially grown GaN films by using AlN-coated sapphire substrates", *Appl. Phys. Lett.*, vol. 42, No. 5, (Mar. 1, 1983), pp. 427-429.

Yoshida, Takehiro, et al., "Ultrahigh-speed growth of GaN by hydride vapor phase epitaxy", *Phys. Status Solidi C*, vol. 8, Issue 7-8, (2011), pp. 2110-2112.

* cited by examiner

BACKFLOW REACTOR LINER FOR PROTECTION OF GROWTH SURFACES AND FOR BALANCING FLOW IN THE GROWTH LINER

CROSS-REFERENCE TO RELATED APPLICATIONS

This application claims the benefit of U.S. Provisional Patent Application No. 61/660,586 filed Jun. 15, 2012.

BACKGROUND OF THE INVENTION

1. Field of the Invention

The present invention relates generally to epitaxial growth systems for production of semiconductor materials and devices, in particular. More specifically, the invention relates to the design of hydride vapor phase epitaxy (HVPE) growth systems and reactors, the design of internal components of HVPE growth systems and reactors, and HVPE-based processes for growth of group III-nitride materials and devices that can be used in optoelectronics as well as in high-power high-frequency electronics.

2. Prior Art

The development of GaN-based optoelectronics and power electronics has led to widespread research into the growth and applications of compounds of aluminum, gallium, indium, boron, and nitrogen (collectively, the "III-nitrides," "group III-nitrides," or "$Al_xIn_yGa_{1-x-y}N$" in which $0 \leq x+y \leq 1$). Group III-nitride templates, junctions, heterojunctions, multi-layer structures, thick layers/films, and bulk materials are commonly grown epitaxially via chemical vapor deposition methods including, but not limited to, hydride vapor phase epitaxy (HVPE) and metalorganic chemical vapor deposition (MOCVD, MOVPE, or OMVPE).

During these deposition processes, a group III-nitride is grown upon a substrate or template consisting of, but not limited to, sapphire, silicon, silicon carbide, magnesium aluminate spinel, gallium nitride, aluminum nitride, aluminum-gallium nitride alloys, indium nitride, and/or lithium aluminate. A template shall be understood to be a substrate of one of the preceding materials coated with a layer of group III-nitride material. For the purposes of this invention, the terms "substrate" and "template" will be used interchangeably, though one skilled in the art will recognize that slightly different growth chemistries are required to optimize a group III-nitride deposition process for each. The differences in required chemistries are independent, however, of the implementation of the invention as described below.

The choice of substrate material, the crystallographic orientation of the substrate, and the deposition method/chemistry strongly influence the crystalline and morphological quality of the group III-nitride grown upon the substrate/template.

During active growth of a III-nitride (the process by which group III-nitride material is added to the surface of a substrate), it is common for a substrate or template to be exposed to a "growth atmosphere" that contains both one or more group III precursors (including but not limited to gallium chloride, aluminum chloride, indium chloride, trimethyl gallium, triethylgallium, trimethyl aluminum, gallium hydride, and gallium metal) and an active nitrogen precursor (typically but not limited to ammonia, hydrazine, or dihydrazine). For the purposes of the present invention, the atmosphere or ambient conditions within a group III-nitride epitaxy chamber will be referred to as a "non-growth atmosphere" if either or both a group III precursor or a nitrogen precursor are absent from the gas phase chemistry in the vicinity of the substrates or templates on which the group III-nitride is grown.

Studies of the thermal and chemical stability of GaN and other III-nitride epilayers in various ambient gases have been undertaken that have demonstrated thermal instability of some of the III-nitrides in common growth ambient environments (see M. A. Mastro, O. M. Kryliouk, M. D. Reed, T. J. Anderson, A. Davydov, and A. Shapiro, Thermal Stability of MOCVD and HVPE GaN Layers in $H_2$, HCl, $NH_3$ and $N_2$, Phys. Stat. Sol. (a) 188 (2001) 467-471 and M. A. Mastro, O. M. Kryliouk, T. J. Anderson, A. Davydov, A. Shapiro, Influence of polarity on GaN thermal stability, Journal of Crystal Growth 274 (2005) 38-46.). For example, on heating in $N_2$, $H_2$, $NH_3$, and HCl, gallium nitride (GaN) can undergo dissociative sublimation or thermal decomposition accompanied in some instances by gallium droplet formation. In both cases the flatness and smoothness of the surface of the epilayer will be adversely affected, making it unusable for further device epitaxy.

It has been found that group III-nitride surfaces are generally more stable in non-growth atmospheres containing predominantly $N_2$ and $NH_3$ than in those containing principally $H_2$, HCl, or Ar. The protective properties of nitrogen and ammonia are considered to be very useful when for some reason growth interruption is required and III-nitride surfaces are left exposed to the non-growth atmosphere (an ambient in which the III-nitride is not being actively deposited or grown). One skilled in the art of III-nitride epitaxy/crystal growth will recognize that III-nitride films and crystals are frequently exposed to such non-growth atmospheres during typical deposition/growth processes, such as during a waiting period for gas mixture homogenization at the beginning of an epitaxial run or during a slow cooling process at the end of the run. Growth interruptions also occur in the middle of the deposition cycles or runs for annealing to improve crystalline quality of the epilayer. Protection of the III-nitride surfaces is specifically important during the interruptions of an epitaxial process in which one of the components of a gas mixture may adversely influence surface morphology. An example of such an interruption can be found in the HVPE III-nitride deposition process employing HCl flow for the in-situ GaCl formation. The unreacted portion of the HCl flow is capable of etching unprotected surfaces of the substrate and epilayer. Indeed, such growth interruptions occur too frequently during a typical growth cycle for simple relocation of the epiwafers or crystals away from the growth zone of the reactor to adjacent so-called dwell zones to be sufficient or practical for ultimate preservation of the episurface. It is clear that there is a need for an effective means to protect heated III-nitride films, episurfaces, and crystals from decomposition. More preferably, there is a need for a means of providing protective gases through the dwell zone of the reactor to the III-nitride materials therein.

It was emphasized during the study of the first steps of the HVPE GaN growth on sapphire substrates that the results of the growth can be significantly influenced by the initial nucleation and nitridation conditions (see S. Gu, R. Zhang, Y. Shi, Y. Zheng, L. Zhang, F. Dwikusuma, T. F. Kuech, The impact of initial growth and substrate nitridation on thick GaN growth on sapphire by hydride vapor phase epitaxy, Journal of Crystal Growth 231 (2001) 342-351). To preserve the surface of the substrates or templates up to the growth temperature of 1100° C., an additional region, called a backflow tube, was introduced into a vertical HVPE reactor.

The gas ambient within the backflow tube was chosen to be either pure $N_2$ or $N_2+NH_3$ mixture depending on the choice of pregrowth treatment. The study confirmed that in the reactor with the backflow tube, improved initiation of the growth can be achieved. Apart from the improvement in the crystalline structure of GaN epilayers, their surface was generally smoother and had reduced density of surface pits, which was a common morphological feature of the grown epilayers. However, there was no specific consideration given to the geometry and position of the backflow tube inside the reactor that would help to prevent potential eddy backflows in the growth zone that could adversely affect III-nitride uniformity and quality. From the point of view of the present invention, when the position of the end of the backflow tube is too close to the growth zone or shape of this end coincides with the shape of the growth zone, gases flowing through the backflow tube will effectively block outflow of the reactive gasses from the growth zone. This blocking will negatively influence epitaxy in the growth zone and reduce all benefits of the backflow use to a minimum by unfavorably modifying the gas phase chemistry in the vicinity of the substrates.

In reference F. Dwikusuma and T. F. Kuech, X-ray photoelectron spectroscopic study on sapphire nitridation for GaN growth by hydride vapor phase epitaxy: Nitridation mechanism, Journal of Applied Physics 94 (2003) 5656-5664 the study of the sapphire nitridation in the backflow region of a vertical HVPE system under a $NH_3$ and $N_2$ ambient was described. It was mentioned that the backflow region allowed the sample to be heated to the temperature of 1100° C. under a countercurrent gas flow, protecting the sample from a gallium precursor stream. Nitridation was carried out by exposing the sapphire to a mixture of $NH_3$ and $N_2$ at a total flow rate of 2 slpm and a total pressure of 1 atm. The nominal reactor diameter near the sample that corresponded to the diameter of backflow region was 6 cm. The strict correspondence of the diameters and shapes of the backflow and growth regions inevitably leads to the generation of the gas vortexes in the growth zone resulting in irreproducible epitaxial condition. Indeed, the prior art has focused on the use of radially symmetrical backflow liners in vertical configurations that are of no use in horizontally configured flow paths and fail to address deleterious eddy current formation.

In a series of patents, the use of a backflow of ammonia for protection of the grown epilayers is claimed. For example, in U.S. Pat. No. 7,727,333 at a final step of the HVPE deposition of indium gallium nitride epilayer, the backflow of ammonia is provided into the reactor to prevent thermal decomposition of the grown epilayer. In the backflow, the substrate with the epilayer is allowed to cool down to the temperature at which decomposition is negligibly small even without ammonia.

In U.S. Pat. Nos. 6,656,272 and 7,670,435 to achieve sharp interlayer interfaces in multilayer structures the backflow gas sources and substrate movement within the growth zone are proposed. Once the growth of one sublayer is completed, the substrate is moved into the growth interruption zone where the backflow of an inert gas insures the interruption of the growth. While the substrate is in the growth interruption zone, the growth zone can be purged with the inert gas and active gas mixture including ammonia is reintroduced. After the growth mixture is uniformly distributed, the substrate is moved back into the growth zone. The Patents description does not include any specifications for optimal geometry of the growth interruption zone.

In U.S. Pat. No. 6,890,809 the backflow direction of argon and/or ammonia gases in the HVPE reactor is proposed to prevent undesirable growth during cooling the substrate with already grown epitaxial structure. In the preferred embodiment, the epitaxial structure comprises a GaN—AlGaN p-n heterojunction and p-type GaN capping layer helping to avoid surface oxidation of p-type AlGaN.

Along with a number of advantages that substantially increase flexibility of the HVPE process, the use of the backflow streams as disclosed in the prior art suffers a major drawback: it is a cause for induced eddy currents that can destroy the laminar pattern of the main gas flow and compromise stability and reproducibility of the group III-nitride growth process (see E. Richter, Ch. Hennig, M. Weyers, F. Habel, J. D. Tsay, W. Y. Liu, P. Brückner, F. Scholz, Yu. Makarov, A. Segal, J. Kaeppeler, Reactor and growth process optimization for growth of thick GaN layers on sapphire substrates by HVPE, Journal of Crystal Growth 277 (2005) 6-12).

The main objective of the present invention is the introduction of a backflow liner that decouples the active/main and counter/backflow gas streams in the growth reactor enriched with the gas counter-flow functionality. A further objective is to provide a backflow liner design that avoids deleterious eddy current formation as has been observed in the prior art and enables laminar gas flow in the vicinity of the growing group III-nitride films.

These objectives are achieved in the epitaxial growth reactor geometry provided herein comprising a main reactor element with an inserted backflow liner axially aligned to the adjacent growth liner and separated from it by the shaped opening that directed gas flow from the growth and backflow liners toward the reactor exhaust.

DETAILED DESCRIPTION OF THE PREFERRED EMBODIMENTS

The present invention addresses the needs of the prior art by presenting a backflow liner component of a III-nitride epitaxy system that ensures the back flow of protective gases to the dwell zone of the reactor. In particular, the present invention provides an epitaxial growth chamber element identified as a backflow liner that provides superior control of gas ambient environments during group III-nitride deposition processes in both growth and non-growth atmospheres. Key details of the invention can be summarized as follows. First, it is found absolutely necessary that the backflow liner shape gas flow so as to protect a subtle epi-ready surface of the substrate during the warming-up time prior to the growth and during growth interruptions in an environment that differs from that intended for treatment and growth.

Second, the protection is fulfilled inside the backflow liner via the protective gas flow entering the reactor counter to the main gas mixture direction. Such a counter flow provides for protection of the substrate while the growth environment reaches steady state condition between the treatment and growth processes. The substrate can be retracted from the growth region into the backflow liner preventing decomposition of the substrate and/or group III-nitride surfaces in the inhomogeneous transient gas flow when the active gases are just enabled.

Third, the use of the backflow liner provides for the avoidance of decomposition of the group III-nitride film grown on the substrate following the growth process. For example, unless protected by an ammonia ambient environment, a GaN film will decompose at typical crystal growth temperatures on the order of 1000 degrees Celsius. After the completion of the growth process, the substrate is retracted into the backflow liner where the ambient is ammonia or nitrogen, where it is protected from such thermal decomposition.

Figure 5:
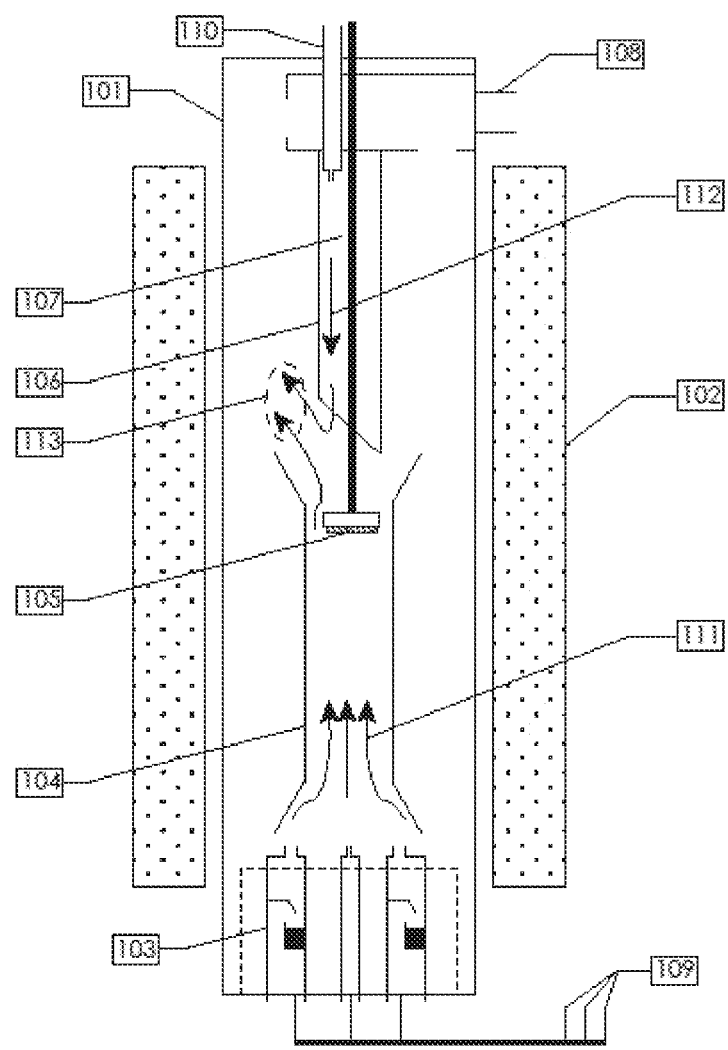
FIG. 5 is a representation of a corresponding vertical-flow, hot-wall Hydride Vapor Phase Epitaxy reactor incorporating the invention.

More particularly, the present invention provides for the implementation of a chemical vapor deposition internal component configuration that allows laminar flow delivery of III-nitride protecting gases to substrates and templates without creation of deleterious eddy currents. For the purposes of this specification, reference will be made to the internal component designs of a HVPE crystal growth machine. However, one skilled in the art will recognize that the geometries and designs illustrated herein may be readily implemented in analogous form in MOCVD tools. Further, while the embodiments described herein utilize a horizontal geometry, the invention can be readily implemented in a vertical configuration. Such a vertical reactor is shown in FIG. 5, with the various parts thereof labeled as per the embodiments to be described, which but for the vertical orientation, are of corresponding design and function.

Figure 1:
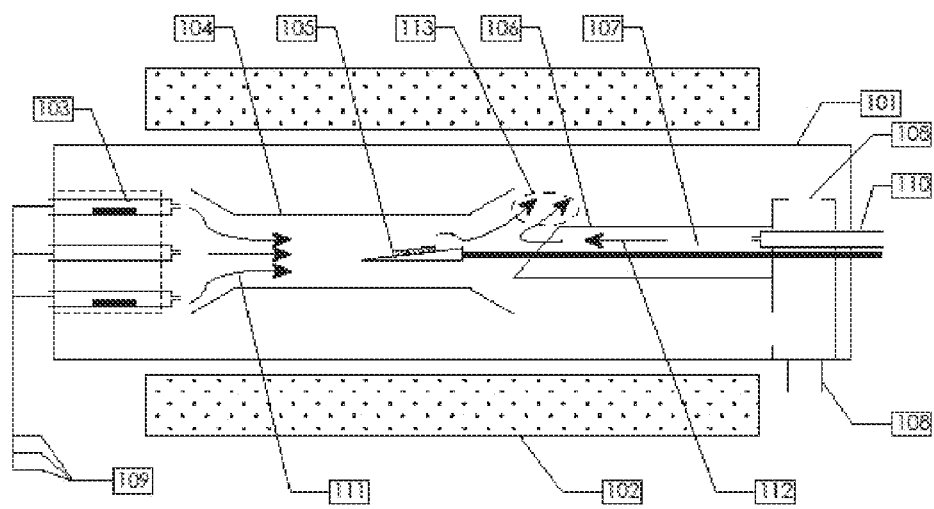
FIG. 1 is a schematic drawing of an example HVPE growth system with the backflow liner including elements: (101) Growth reactor; (102) Heater; (103) Source zone; (104) Growth liner; (105) Substrate holder; (106) Backflow liner; (107) Dwell zone; (108) Reactor exhaust; (109) gas supply tubes, and (110) backflow gas supply injector, Block (111) depicts the direction of source gas flow, block (112) depicts the gas flow direction within the backflow liner, and block (113) illustrates the gas flow exiting the oblique angled end of the backflow liner.

An axial cross-sectional illustration of one embodiment is provided in FIG. 1. The growth system 100 includes growth chamber/reactor 101 represented by a horizontally configured containment tube surrounded by an external heater 102. While the external heater is illustrated as being external to the containment tube, implementing a "hot-walled" growth chamber design, the invention may be executed utilizing an internal heater in close proximity to the substrates (a "cold-walled" design). The embodiment also envisions a resistive tubular heater. However, other heating methods including but not limited to lamp and radio-frequency heating are compatible with the invention. The heater illustrated in FIG. 1 may consist of a single temperature zone, but more commonly will be divided into two to twenty independently controlled heating zones to provide for shaping of the thermal profile in the growth chamber.

A variety of components are commonly included inside of the containment tube as shown in FIG. 1. Block 103 illustrates the source zone of the chamber from which precursor and carrier gases are injected into the chamber through one or more delivery tubes. Block 104 represents the growth liner that surrounds the substrate holder 105. The backflow liner 106 is positioned downstream of the growth liner, within which a dwell zone 107 exists to which substrates can be retracted and held in a favorable non-growth atmosphere. Protective gases are injected into the backflow liner via one or more injectors 110. The reactor exhaust 108 is downstream of the dwell zone. The general flow direction of the source gases is depicted by block 111, the counter flow of gases injected into the backflow liner is depicted by block 112, the combined source and backflow gases exit the growth region via flow lines generally depicted by block 113.

Figure 2:
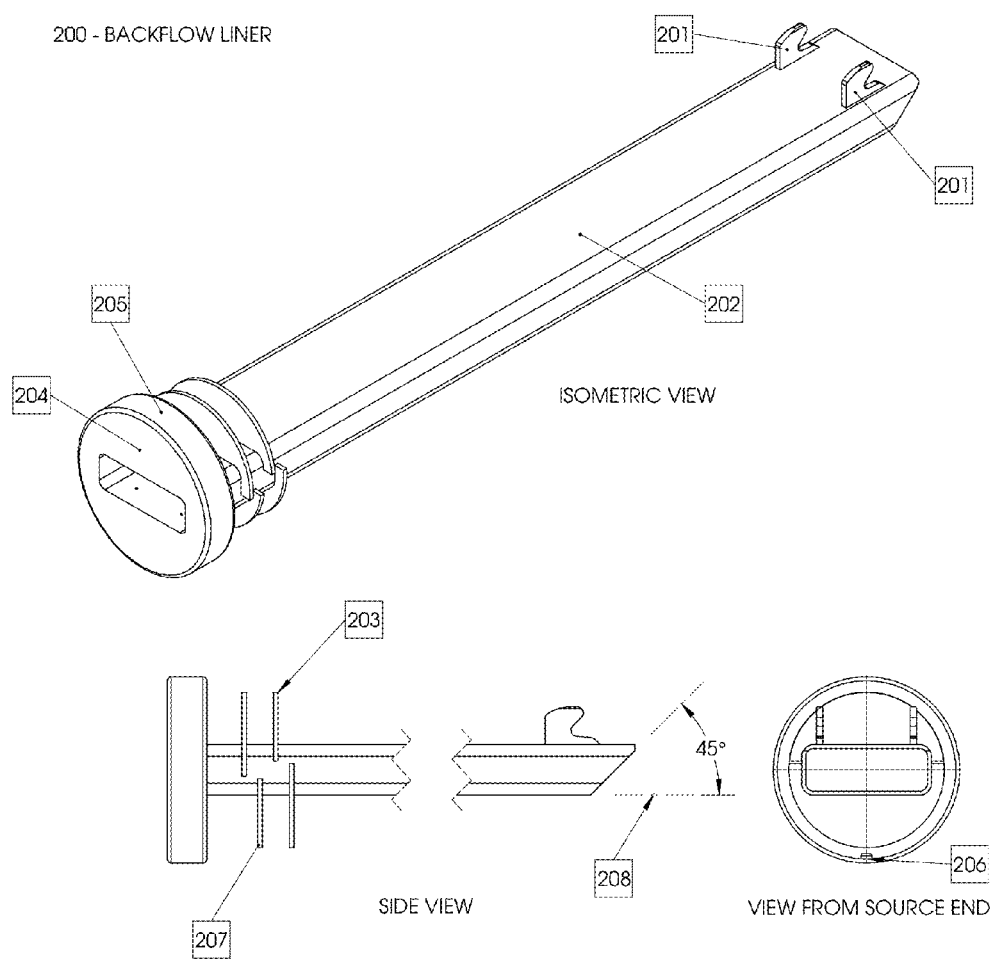
FIG. 2 is an isometric view of the quartz backflow liner including elements: (201) skids at the shaped oblique end of the liner made to align its position with the growth liner; (202) the rectangular body of the liner; (203) and (204) thermal shields; (205) thermal insulation ring at the flange end of the liner; (206) an engaging hole; and (207) a thermal shield.

The backflow liner 106 in FIG. 1 is illustrated in detail in FIG. 2 as block 200. This liner can be generically characterized as a gas flow directing element consists of an assembly of welded plates having a generally rectangular cross-section over the majority of its length. The backflow liner consists of rectangular cross-section region 202 in which protective gases may be injected counter to the flows from the source end of the growth chamber. The backflow liner includes an oblique angle 208 at the end of the element that lies in proximity to the growth liner 104 as illustrated in FIG. 1. The oblique angle 208 may vary from approximately 1 degree to approximately 179 degrees depending on the design of adjacent components in the growth chamber 101. Most preferably, the oblique angle should be approximately 45 degrees. Optional features of the backflow liner that are illustrated in FIG. 2 include alignment skids 201 that position the growth liner relative to the backflow liner, thermal shields and insulating rings 203, 204, 205 and 207 to block transmission of infrared radiation into cold regions of the growth chamber, and an alignment hole 206 for positioning the growth liner relative to other chamber components.

In the preferred embodiment, the backflow liner 106 is fabricated of fused silica (silicon dioxide), but other materials including but not limited to sapphire, alumina, silicon carbide, boron nitride or a combination thereof are suitable for its fabrication as well. The backflow liner 106 is designed to transport protective ammonia gas at a flow rate ranging from >1 to <50 slpm flow rate. More preferably, the liner illustrated in FIG. 2 transports approximately 5 slpm of ammonia counter to the principal gas flow direction within in the growth chamber. Alternately, the backflow liner may transport a mixture of gases including but not limited to ammonia, nitrogen, argon, and/or hydrogen at flow rates ranging from >1 to <50 slpm in the direction opposite to the main flow in the reactor. The flow in the backflow liner may be continuous, or only when needed, or may be adjusted between two or more levels when used and when simply being purged to be ready for use.

Figure 3:
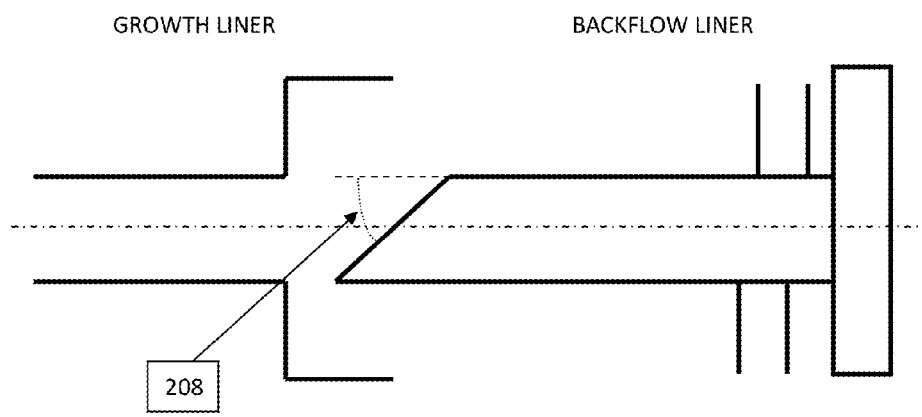
FIG. 3 is a schematic illustration of the backflow liner aligned with the growth liner position of the backflow liner according to the present invention.

In the preferred embodiment, the backflow liner 106 is inserted in the main reactor tube from the growth chamber's substrate loading end. The rectangular cross-sectional shape of the backflow liner 106 coincides with the cross sectional shape of the majority of the opposing growth liner 104. The two liner elements are axially aligned and preferably separated by a gap leaving the shaped oblique opening for the gas stream from the liners to be directed towards the reactor exhaust (FIG. 3). Preferably the size of the exit of the backflow liner 106 will be less than the size of the exit of the growth liner 104, whether the exit of the growth liner 104 has a configuration as shown in FIG. 1, as shown in FIG. 3 or some other shape. The value of the oblique angle 208 has been chosen to be 45 degrees in the preferred embodiment.

This angle is important for proper ratio of back and direct gas flow rates that defines vortex-free condition in the growth reactor. The backflow gas may be, by way of example, $NH_3$, $N_2$, Ar, or a mixture thereof as supplied by a source connected to the injector 110.

The opposing flows from the growth and backflow liners meet at the gap between their ends. The shaped oblique end of the backflow liner 106 promotes further direction of the gas flow mixture towards the exhaust from the main reactor tube. Due to the low disturbance of the gas stream at the end of the growth liner 104, vortex-free gas flow inside the growth liner can be obtained.

Figure 4:
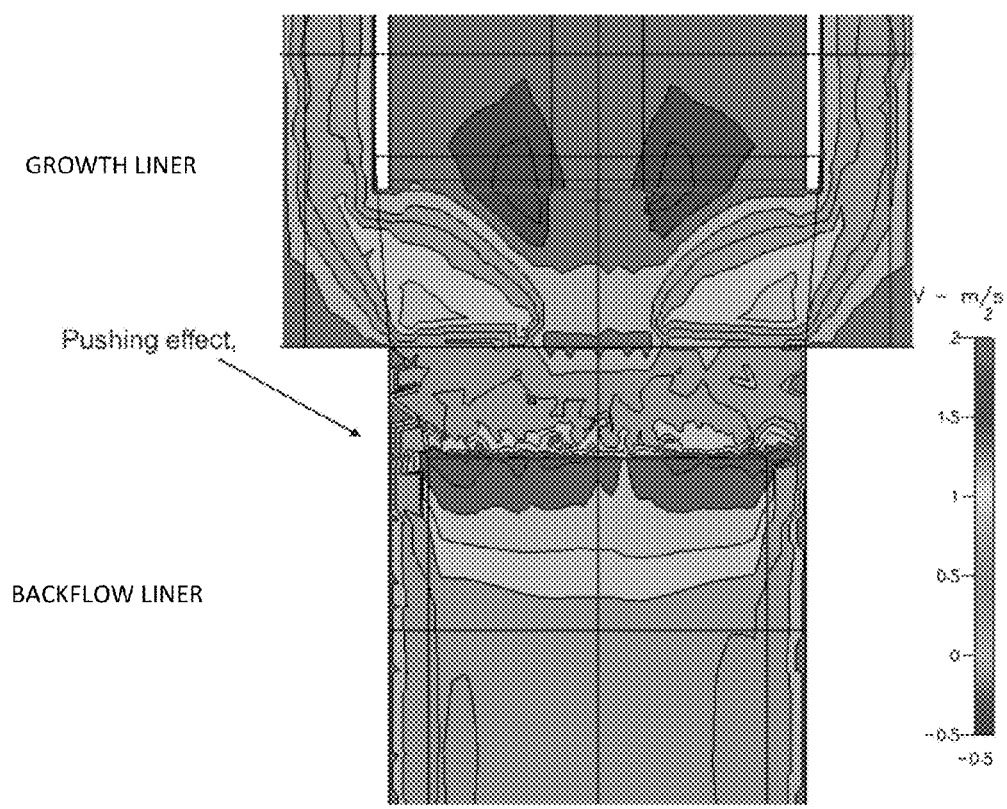
FIG. 4 shows a simulation pattern of the gas flow distribution between the growth liner (lower part) and backflow liner (upper part of the figure). It is shown that due to the pushing effect of the gases from the growth liner, vortices are displaced out of the growth zone to the backflow liner.

Achievement of vortex-free gas flow within the growth liner depends both on the design of the backflow liner as provided herein and optimization of the ratio of gas injected from the source end of the chamber to that injected through the backflow liner. This source-to-backflow gas ratio is generally preferred to range from 1 to 10, and more preferably from 3 to 6. For the particular geometry utilized in this embodiment, vortex-free conditions in the growth region of the reactor are achieved when 10 slpm of $NH_3$ and 23 slpm of Ar are directed through the growth liner, while 5 SLPM of $NH_3$ and 5 SLPM Ar was directed through the backflow liner. Such vortex-free conditions have been demonstrated both experimentally in HVPE group III-nitride growth and confirmed using numerical simulation of the growth reactor as illustrated in FIG. 4. Deviation of the source-to-backflow ratio from the range prescribed above leads to the parasitic deposition of group III-nitrides inside the backflow liner and could result in surface etching of the epilayers since gas pressure at the front of backflow liner is insufficient to force gases from the growth liner to the reactor exhaust.

Implementation of the preferred embodiment in a group III-nitride HVPE growth system yielded superior uniformity of deposition across multiple substrates placed on the substrate holder 105. In practice, the invention provided for achievement of less than 5% thickness variation across individual 2-inch diameter substrates and less than 10% thickness variation within a batch of 12 co-loaded substrates in the growth zone on the substrate holder. The invention provides a further advantage over the prior art in that at optimal source-to-back flow gas flow ratio a parasitic deposition in the backflow liner and in the main reactor tube is reduced, in many cases to zero parasitic deposition.

As an another advantage of using optimal source-to-backflow ratio in conjunction with the backflow liner, simultaneous etch cleaning of the reactor with hydrogen chloride during cooling of the templates in the backflow liner can be achieved without fear of damaging their smooth epitaxial surface. Performing such etching/cleaning processes without the need to cool the chamber to unload the group III-nitride materials that have been previously grown reduces process cycle time and increases throughput compared to the prior art.

An added advantage of the invention is the reduction of the time required for purging of the growth chamber after insertion of the epitaxial substrates into it, either before or after group III-nitride deposition. Such time reductions are firstly due to uninterruptible purging of the backflow liner with protective gases and secondly due to reduced volume of the backflow liner compared to the full reactor. Gas flowing through the backflow liner constantly purges it. While the substrate is still cooling down within the liner, the protective environment inside the liner makes simultaneous post-growth etching of the reactor possible.

The backflow liner described in the preferred embodiment can be used not only during the growth of a single epitaxial layer but repeatedly for the multiple epitaxial layers. A structure that includes multiple epitaxial layers may have different constituents, like GaN and AlGaN, different compositions of the constituents, like $Al_xGa_{1-x}N$ and $Al_yGa_{1-y}N$, or different sequences of those compositions. The main purpose for using the backflow liner remains unchanged: to protect the substrates or grown epilayers from the harsh, unsteady environment outside the backflow liner. It is necessary while the growth environment reaches the steady state condition between the treatment and the growth process; while the wafers are at a high temperature close to decomposition temperature after the growth or between the following growth interruptions. Unless being protected by ammonia ambient in the backflow environment, GaN or its III-N alloys are prone to decompose with time. Every time when decomposition is probable wafers are retracted into the backflow liner filled with the ammonia-rich protective atmosphere.

One skilled in the art will recognize that many variations of the invention may be implemented that are wholly or partially equivalent to those described in the present application, and it is here intended to cover all said equivalent measures and approaches falling in the scope of the present invention and defined by the following claims. For example, but without limitation, it may be desirable for the backflow liner to possess an oblong cross-section either wholly or in part as opposed to the rectangular cross-section described in the preferred embodiment. Similarly, the optional features illustrated in FIG. 2 may be omitted entirely, or may be designed as separate, interlocking components that mate with the backflow liner or adjacent components. Alternately, the backflow liner could be vertically oriented rather than horizontally oriented. The dimensions of such a vertically oriented backflow liner may be modified to account for convective flow effects, or the desirable source-to-backflow flow ratios may be adjusted to account for convection. Such examples of variations of the backflow liner design are consistent with the intent of the invention.

Thus the present invention has a number of aspects, which aspects may be practiced alone or in various combinations or sub-combinations, as desired. While a preferred embodiment of the present invention has been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. An epitaxial growth system comprising:
a growth reactor;
a growth liner having an entrance and an exit at each end of the growth liner;
a substrate holder;
a source zone;
a backflow liner having an entrance and an exit at each end of the backflow liner, the exit of the backflow liner comprising a predominately rectangular or oblong cross-section;
a backflow liner source; and
a reactor exhaust;
the backflow liner having an axis substantially aligned with an axis of the growth liner;
the entrance of the backflow liner being coupled to the backflow liner source and the exit of the backflow liner being oblique to the axis of the backflow liner, wherein the exit of the growth liner having a flow directing wall larger than the exit of the backflow liner;

the oblique exit of the backflow liner being disposed adjacent to the flow directing wall of the growth liner exit, such that the oblique exit of the backflow liner and the flow directing wall of the growth liner exit being separated by a gap to directly face each other, whereby two counter-flowing gas streams from each of the backflow liner and the growth liner are combined and directed toward the reactor exhaust through the gap;

the substrate holder being mounted within the growth reactor for movement between a position within the growth liner to a position within the backflow liner while holding at least one substrate.

2. The epitaxial growth system of claim 1 wherein the oblique angle is approximately 45 degrees.

3. The epitaxial growth system of claim 1 wherein the backflow liner comprises a sapphire, silicon dioxide, aluminum oxide, silicon carbide, boron nitride, or a combination thereof, backflow liner.

4. The epitaxial growth system of claim 1 wherein the backflow source is coupled to a source of $NH_3$, $N_2$, Ar, or a mixture thereof.

5. The epitaxial growth system of claim 4 wherein the backflow liner is configured to protect surfaces of epitaxial growth substrates during a heat-up time prior to a pretreatment, protects epitaxial growth substrates while a growth environment reaches steady-state condition between a pretreatment and a growth process, or prevents decomposition of epitaxial growth products after the growth process when the $NH_3$, $N_2$, Ar, or a mixture thereof is flowing through the backflow liner.

6. The epitaxial growth system of claim 4 wherein the reactor is a Hydride Vapor Phase Epitaxy crystal growth reactor.

7. The epitaxial growth system of claim 1 wherein the reactor comprises a horizontal-flow, hot-wall Hydride Vapor Phase Epitaxy reactor for the growth of III-nitride semiconductors.

8. The epitaxial growth system of claim 1 wherein the growth liner has a predominantly rectangular cross-section.

9. The epitaxial growth system of claim 1 wherein the reactor is for the growth of uniform layers and multilayer structures and devices on sapphire substrates having one of generally c-, m-, r-, or a-plane orientation.

10. The epitaxial growth system of claim 1 for the growth of one or more layers of $Al_xIn_yGa_{1-x-y}$ where x and y range from 0 to 1, inclusive and $x+y \leq 1$.

11. The epitaxial growth system of claim 10 for growing the one or more layers of $Al_xIn_yGa_{1-x-y}$ on a group III-nitride substrate.

12. The epitaxial growth system of claim 10 wherein the one or more layers of $Al_xIn_yGa_{1-x-y}$ in conjunction with an initial substrate constitutes a group III-nitride template.

13. The epitaxial growth system of claim 10 wherein the one or more layers of $Al_xIn_yGa_{1-x-y}$ in conjunction with a starting substrate constitutes a light emitting diode structure on the substrate.

14. The epitaxial growth system of claim 10 wherein the one or more layers of $Al_xIn_yGa_{1-x-y}$ in conjunction with a starting substrate constitutes a laser diode structure on the substrate.

15. The epitaxial growth system of claim 10 wherein the one or more layers of $Al_xIn_yGa_{1-x-y}$ in conjunction with a starting substrate, constitutes a transistor structure on the substrate.

16. An epitaxial growth system comprising:
a Hydride Vapor Phase Epitaxy crystal growth reactor for the growth of III-nitride semiconductors;
a growth liner having an entrance and an exit at each end of the growth liner;
a substrate holder;
a source zone;
a silicon dioxide, aluminum oxide, silicon carbide, or boron nitride backflow liner having an entrance and an exit at each end of the backflow liner, the exit of the backflow liner comprising a predominately rectangular or oblong cross-section;
a backflow liner source of NH3, N2 or their mixture with argon coupled to the backflow liner; and
a reactor exhaust;
the backflow liner having an axis substantially aligned with an axis of the growth liner;
the entrance of the backflow liner being coupled to the backflow liner source and the exit of the backflow liner being oblique to the axis of the backflow liner, wherein the exit of the growth liner having a flow directing wall larger than the exit of the backflow liner;
the oblique exit of the backflow liner being disposed adjacent to the flow directing wall of the growth liner exit, such that the oblique exit of the backflow liner and flow directing wall of the growth liner exit being separated by a gap to directly face each other, whereby two counter-flowing gas streams from each of the backflow liner and the growth liner are combined and directed toward the reactor exhaust through the gap;
the substrate holder being mounted within the growth reactor for movement between a position within the growth liner to a position within the backflow liner while holding at least one substrate.

17. The epitaxial growth system of claim 16 wherein the backflow liner is configured to protect surfaces of epitaxial growth substrates during the heat-up time prior to pretreatment, protects epitaxial growth substrates while a growth environment reaches a steady-state condition between the pretreatment and the growth process, or prevents decomposition of epitaxial growth products after the growth process when the $NH_3$, $N_2$, Ar or a mixture thereof is flowing through the backflow liner.

18. The epitaxial growth system of claim 16 wherein the reactor comprises a horizontal-flow, hot-wall Hydride Vapor Phase Epitaxy reactor.

19. The epitaxial growth system of claim 16 wherein the reactor comprises a vertical-flow, hot-wall Hydride Vapor Phase Epitaxy reactor.

20. The epitaxial growth system of claim 16 wherein the growth liner has a predominantly rectangular cross-section.

21. The epitaxial growth system of claim 16 wherein for the growth of uniform layers and multilayer structures and devices on sapphire substrates having one of generally c-, m-, r-, or a-plane orientation.

22. The epitaxial growth system of claim 16 for the growth of uniform layers and multilayer structures and devices on one or more substrates comprising silicon, silicon carbide, lithium aluminate, magnesium aluminate, or sapphire.

* * * * *